(12) United States Patent
Okino

(10) Patent No.: US 6,188,612 B1
(45) Date of Patent: Feb. 13, 2001

(54) SEMICONDUCTOR MEMORY

(75) Inventor: Yasushi Okino, Nara-ken (JP)

(73) Assignee: Sharp Kabushiki Kaisha (JP)

( * ) Notice: Under 35 U.S.C. 154(b), the term of this patent shall be extended for 0 days.

(21) Appl. No.: 09/502,121

(22) Filed: Feb. 10, 2000

(30) Foreign Application Priority Data

May 25, 1999 (JP) .................................................. 11-145649

(51) Int. Cl.⁷ ...................................................... G11C 7/00
(52) U.S. Cl. ............................... 365/185.25; 365/185.23; 365/203
(58) Field of Search ...................................... 365/203, 194, 365/185.2, 185.23, 185.25

(56) References Cited

U.S. PATENT DOCUMENTS 6,115,290 * 9/2000 Kwong ............................. 365/185.25

FOREIGN PATENT DOCUMENTS 09231783    9/1997 (JP) .

\* cited by examiner

Primary Examiner—Terrell W. Fears
(74) Attorney, Agent, or Firm—Morrison & Foerster LLP

(57) ABSTRACT

A semiconductor memory includes: a plurality of memory cell transistors: a plurality of first bit lines; a plurality of second bit lines; a first transistor provided between a charging section for charging at least one of the plurality of first bit lines and the plurality of memory cell transistors; and a second transistor provided between a discharging section for discharging at least one of the plurality of second bit lines and the plurality of memory cell transistors, wherein one of a source region and a drain region of each of the plurality of memory cell transistors is formed as a part of one of the plurality of first bit lines, and the other of a source region and a drain region is formed as a part of one of the plurality of second bit lines; an ON/OFF state of the first transistor is controlled based on a first signal; an ON/OFF state of the second transistor is controlled based on a second signal; and the second signal is provided to the second transistor at a time which is delayed for a predetermined period from a time that the first signal is provided to the first transistor.

7 Claims, 5 Drawing Sheets

SEMICONDUCTOR MEMORY

BACKGROUND OF THE INVENTION

1. Field of the Invention

The present invention relates to a semiconductor memory. Specifically, the present invention relates to a semiconductor read only memory wherein information stored in memory cells are read.

2. Description of the Related Art

FIG. 5 shows a conventional semiconductor read only memory (ROM) 500. The semiconductor read only memory 500 includes a memory cell array including a plurality of memory cell transistors M1, M2, M3, . . . Mn, word lines WL1, WL2, . . . WLn, bit lines BIT11, BIT12, . . . BIT1n, and bit lines BIT21, BIT22, . . . BIT2n. (The memory cell transistor Mn and the bit lines BIT1n and BIT2n are not shown.) The plurality of memory cell transistors M1, M2, M3, . . . Mn are arranged in a matrix, and these transistors are MOS transistors. The word lines WL1, WL2, . . . WLn are connected to gate electrodes of the plurality of memory cell transistors. The bit lines BIT11 to BIT1n are connected to drain electrodes of the plurality of memory cell transistors, and the bit lines BIT21 to BIT2n are connected to source electrodes of the plurality of memory cell transistors.

The bit lines BIT11 and BIT12 are also connected to source electrodes of bit line selecting transistors Tr12 and Tr11, respectively. The bit lines BIT21 and BIT22 are also connected to drain electrodes of bit line selecting transistors Tr21 and Tr22, respectively. Gate electrodes of the bit line selecting transistors Tr11 and Tr12 are connected to bit line selecting lines BS11 and BS12, respectively. Drain electrodes of the bit line selecting transistors Tr11 and Tr12 are connected to a drain electrode of a charging transistor Tr4 for a reading operation (hereinafter, referred to as "read charging transistor Tr4"). A source electrode and a gate electrode of the read charging transistor Tr4 are connected to a power supply VDD. Gate electrodes of the bit line selecting transistors Tr21 and Tr22 are connected to bit line selecting lines BS21 and BS22, respectively. Source electrodes of the bit line selecting transistors Tr21 and Tr22 are connected to a ground GND.

Now, an operation for reading data stored in the memory cell transistor M2 of the semiconductor read only memory 500 is described.

Consider a case where data stored in the memory cell transistor M2 is "0". In order to read the data stored in the memory cell transistor M2, the bit lines BIT12 and BIT21 connected to the memory cell transistor M2 conduct a current. At this time, the bit line selecting lines BS11 and BS21 are high, whereas the bit line selecting lines BS12 to BS1n and BS22 to BS2n, except the bit line selecting lines BS11 and BS21, are low.

The selected bit line BIT12 is charged up to an intermediate potential through the read charging transistor Tr4 by the power supply VDD, whereas the selected bit line BIT21 goes to a ground level. Then, the word line WL2 connected to the memory cell transistor M2 goes high. The word line WL1 and the word lines WL3 to WLn, except the word line WL2, remain low. The selected bit lines BIT12 and BIT21 are connected to each other through the memory cell transistor M2, thereby forming a DC current route from the power supply VDD to the ground GND. The potential of the power supply VDD is resistive-divided by each of the resistances which are loads of the DC current route, resulting in the potential of an output signal line Dbit.

Next, consider a case where the data stored in the memory cell transistor M2 is "1". In this case, even if the word line WL2 goes high, the memory cell transistor M2 does not conduct a current. Therefore, the DC current route is not formed, and the output signal line Dbit is maintained at the intermediate potential. A sense amplifier (not shown) is capable of reading data stored in a memory cell from the change of level of the output signal line Dbit caused by the difference in data between memory cell transistors.

In the semiconductor read only memory 500 shown in FIG. 5, a sense amplifier senses a voltage drop which has been caused by a current flowing in a memory cell transistor selected by a bit line and a word line. In FIG. 5, a transition of the word line WL2 to a high level selects the memory cell transistor M2. At this time, the memory cell transistors M1 and M3 adjacent to the memory cell transistor M2 are also selected. Therefore, the bit line BIT21 connected to the memory cell transistor M1 is connected to the bit line BIT11 through the memory cell transistor M1. Since the bit line BIT11 contains a charge remaining from the previous read operation, a current flows to the bit line BIT21 through the memory cell transistor M1. This varies the value of the currents flowing through the bit lines BIT21 and BIT12.

Thus, the semiconductor read only memory 500 has difficulty in correctly reading data stored in a memory cell transistor.

Furthermore, since the semiconductor read only memory 500 is required to keep currents flowing through bit lines during a reading operation, the power consumption is increased. In order to address such a problem, for example, Japanese Laid-Open Publication No. 9-231783 discloses a method for correctly reading data by measuring the potential of a bit line which is less susceptible to a leakage current.

FIG. 6 shows an NOR type semiconductor storage device 600 wherein the potential of a bit line which is less susceptible to a leakage current is measured.

In the NOR type semiconductor storage device 600, a plurality of memory cells are connected to a word line WLn. Therefore, when a word line WL2 goes high, memory cell transistors M1, M2, and M3 connected to the word line WL2 are turned ON. As a result, a bit line current Ibit1 is divided into, for example, three currents routed through route 1, route 2 and route 3.

When leakage currents flowing through route 2 and route 3 occur, the value of bit line current Ibit1 varies. However, since the resistance between the source electrode and the drain electrode of the memory cell transistors M2 is larger relative to the off resistances of the bit line selecting transistors Tr11 and Tr12, a variation of a bit line current Ibit2 flowing through a bit line BIT21 is smaller than a variation of a bit line current Ibit1 flowing through a bit line BIT12.

In the semiconductor read only memory 500 shown in FIG. 5, the potential of the output signal line Dbit is affected by the variation of the bit line current Ibit1. Accordingly, it is difficult to correctly read information stored in the memory cell transistors. In the NOR type semiconductor read only memory 600 shown in FIG. 6, information stored in the memory cell transistors are read by using the bit line current Ibit2 flowing through the bit line BIT21, whose variation is less than that of the bit line current Ibit1 flowing through the bit line BIT12. Specifically, the information stored in the memory cell transistors can be read correctly from the potential of the output signal line Dbit which is caused by a leakage section connected to the bit line BIT21 through a column selecting section. However, since the bit line current is kept flowing through the leakage section, the power consumption is large.

Furthermore, in the NOR type semiconductor read only memory 600 shown in FIG. 6, the resistance of the leakage section is set to a large value in order to improve the accuracy of a reading operation. Such a large resistance value of the leakage section increases a change of the potential of a bit line to be read, thereby improving the accuracy of a reading operation. However, as the resistance value increases, the reading rate decreases accordingly.

SUMMARY OF THE INVENTION

According to one aspect of the present invention, a semiconductor memory includes: a plurality of memory cell transistors; a plurality of first bit lines; a plurality of second bit lines; a first transistor provided between a charging section for charging at least one of the plurality of first bit lines and the plurality of memory cell transistors; and a second transistor provided between a discharging section for discharging at least one of the plurality of second bit lines and the plurality of memory cell transistors, wherein one of a source region and a drain region of each of the plurality of memory cell transistors is formed as a part of one of the plurality of first bit lines, and the other of a source region and a drain region is formed as a part of one of the plurality of second bit lines; an ON/OFF state of the first transistor is controlled based on a first signal; an ON/OFF state of the second transistor is controlled based on a second signal; and the second signal is provided to the second transistor at a time which is delayed for a predetermined period from a time that the first signal is provided to the first transistor.

In one embodiment of the present invention, the second transistor is ON at a time when charging for at least one of the plurality of first bit lines is started by the charging section.

In another embodiment of the present invention, the second transistor is turned OFF at a time when a predetermined period has passed since the start of charging.

In still another embodiment of the present invention, the semiconductor memory further comprises a delay circuit for delaying the first signal so as to generate the second signal and providing the second signal to the second transistor.

In still another embodiment of the present invention, a potential of at least one of the plurality of second bit lines is used as an output signal.

In still another embodiment of the present invention, the conductive type of the first transistor is different from that of the second transistor.

In still another embodiment of the present invention, the first and second transistors are MOS transistors.

A semiconductor read only memory of the present invention includes memory cells (memory cell transistors) arranged in a matrix. Source electrodes and drain electrodes of the memory cell transistors in each column are formed as parts of bit lines, respectively, and these bit lines are alternately provided. One of the bit lines is used as a charging path for a reading operation. Through the other of the bit lines and a discharging transistor, memory cell transistors are connected to a ground GND. Preferably, the discharging transistor is a Nch type MOS transistor, whose source electrode is connected to the ground GND. The voltage at the drain electrode of the discharging transistor is used as a voltage to be read. The present invention is characterized in that a signal which is delayed from the start time of charging period by the delay circuit is provided to a signal line through which a signal is provided to a gate electrode of the Nch MOS transistor connected to the ground GND.

In the semiconductor read only memory of the present invention having the structure as described above, correct reading of data stored in the memory cells can be achieved, while the memory cells can be read with a consumption current smaller than that consumed in the semiconductor read only memory according to the conventional art. That is, in the semiconductor read only memory of the present invention, the time period during which a direct current flows is shortened by a timing control, and the potential of a bit line, which is not susceptible to a leakage current and the like, is measured, whereby correct reading can be realized while significantly reducing the consumption current.

Thus, the invention described herein makes possible the advantage of providing a semiconductor read only memory wherein data stored in memory cell transistors are correctly read while the power consumption during a reading operation is reduced.

This and other advantages of the present invention will become apparent to those skilled in the art upon reading and understanding the following detailed description with reference to the accompanying figures.

DESCRIPTION OF THE PREFERRED EMBODIMENTS

Hereinafter, an embodiment of the present invention will be described with reference to the drawings.

Figure 1:
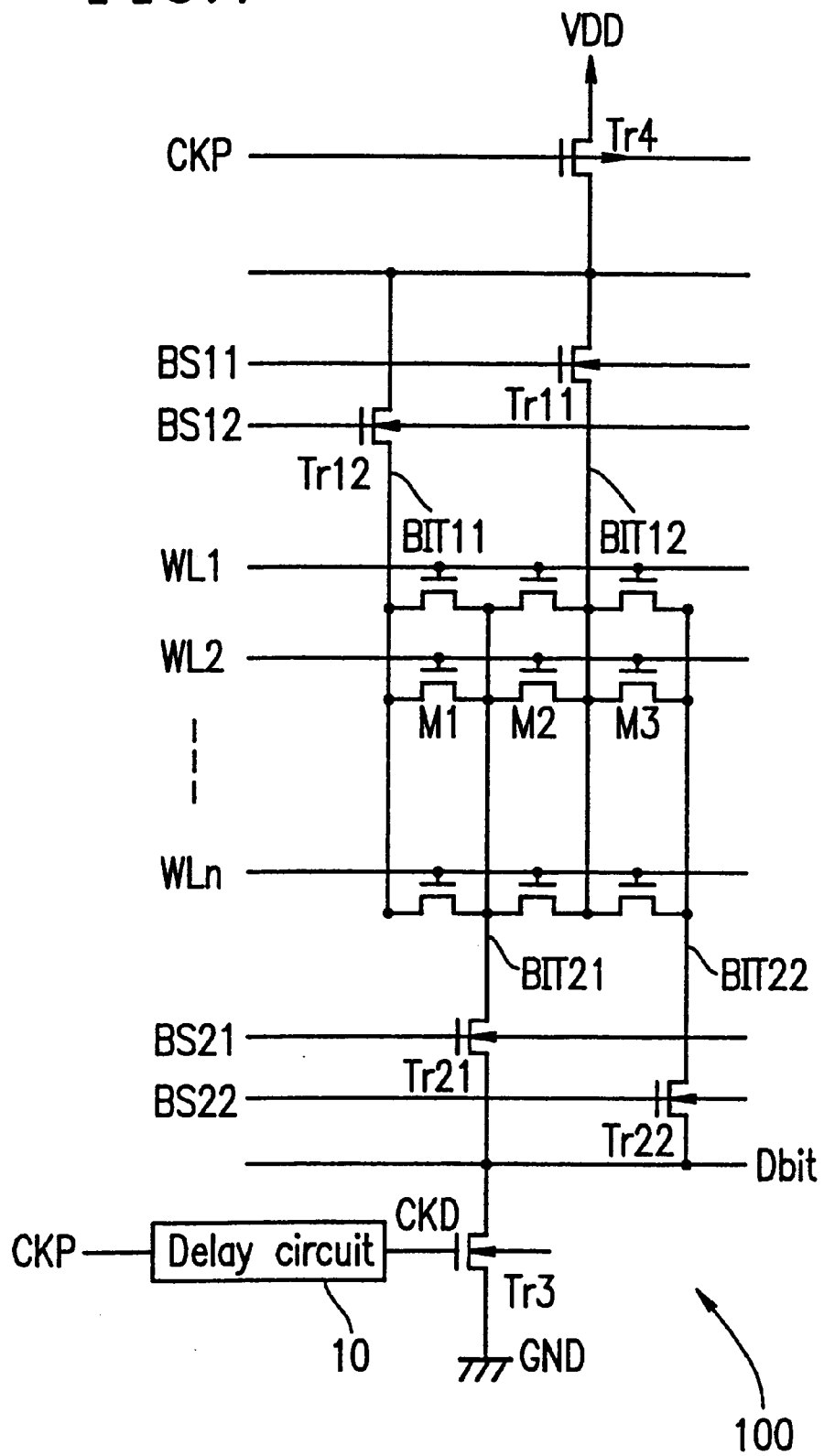
FIG. 1 shows a structure of a semiconductor read only memory according to one embodiment of the present invention.

FIG. 1 shows a semiconductor memory 100 according to the embodiment of the present invention. The semiconductor memory 100 includes a memory cell array including a plurality of memory cell transistors M1, M2, M3, . . . Mn, word lines WL1, WL2, . . . WLn, bit lines BIT11, BIT12, . . . BIT1n, and bit lines BIT21, BIT22, . . . BIT2n. (The memory cell transistor Mn and the bit lines BIT1n and BIT2n are not shown.) The plurality of memory cell transistors M1, M2, M3, . Mn are arranged in a matrix, and these transistors are MOS transistors. The word lines WL1, WL2, . . . WLn are connected to gate electrodes of the memory cell transistors M1, M2, M3, . . . Mn. The bit lines BIT11 to BIT1n are connected to drain electrodes of the memory cell transistors M1, M2, M3, . . . Mn, and the bit lines BIT21 to BIT2n are connected to source electrodes of the memory cell transistors M1, M2, M3, . . . Mn. In FIG. 1, only the bit lines BIT11, BIT12, BIT21, and BIT22 are shown from among bit lines BIT1n and BIT2n.

The bit line BIT11 is connected to a source electrode of bit line selecting transistor Tr12. The bit line BIT12 is connected to a source electrode of bit line selecting transistor Tr11. The bit lines BIT21 and BIT22 are connected to drain electrodes of bit line selecting transistors Tr21 and Tr22, respectively.

Gate electrodes of the bit line selecting transistors Tr11 and Tr12 are connected to bit line selecting lines BS11 and BS12, respectively. Drain electrodes of the bit line selecting transistors Tr11 and Tr12 are connected to a drain electrode of a read charging transistor Tr4.

Figure 2:
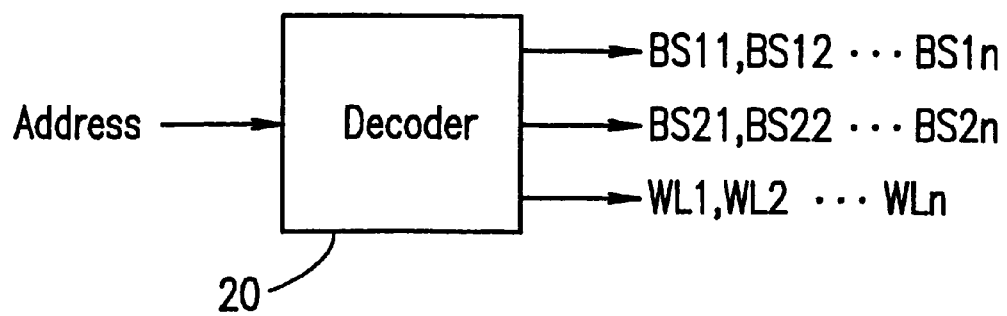
FIG. 2 shows a decoder which functions as both a word line selecting section and a bit line selecting section.

FIG. 2 shows a decoder circuit 20. The decoder circuit 20 receives an address signal and, based on the address signal, generates a signal for controlling the bit line selecting lines BS11, BS12, . . . BS1n and BS21, BS22, . . . BS2n (hereinafter, referred to as "bit line selecting signal") and a signal for controlling the word lines WL1, WL2, . . . WLn.

Figure 3:
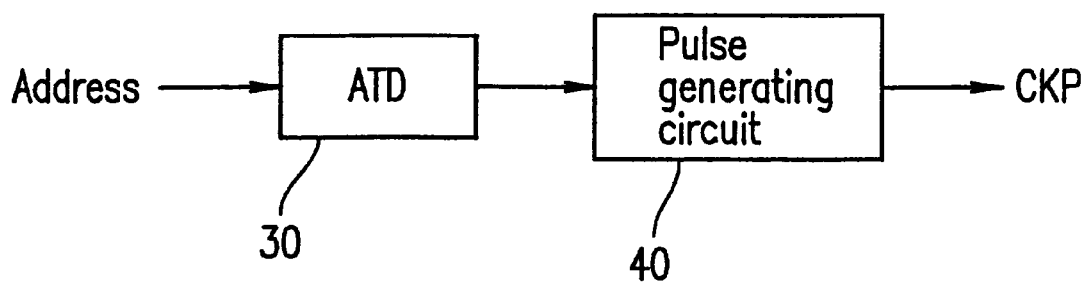
FIG. 3 shows a pulse generating circuit and an ATD circuit which function together as a trigger pulse generating circuit.
Figure 4:
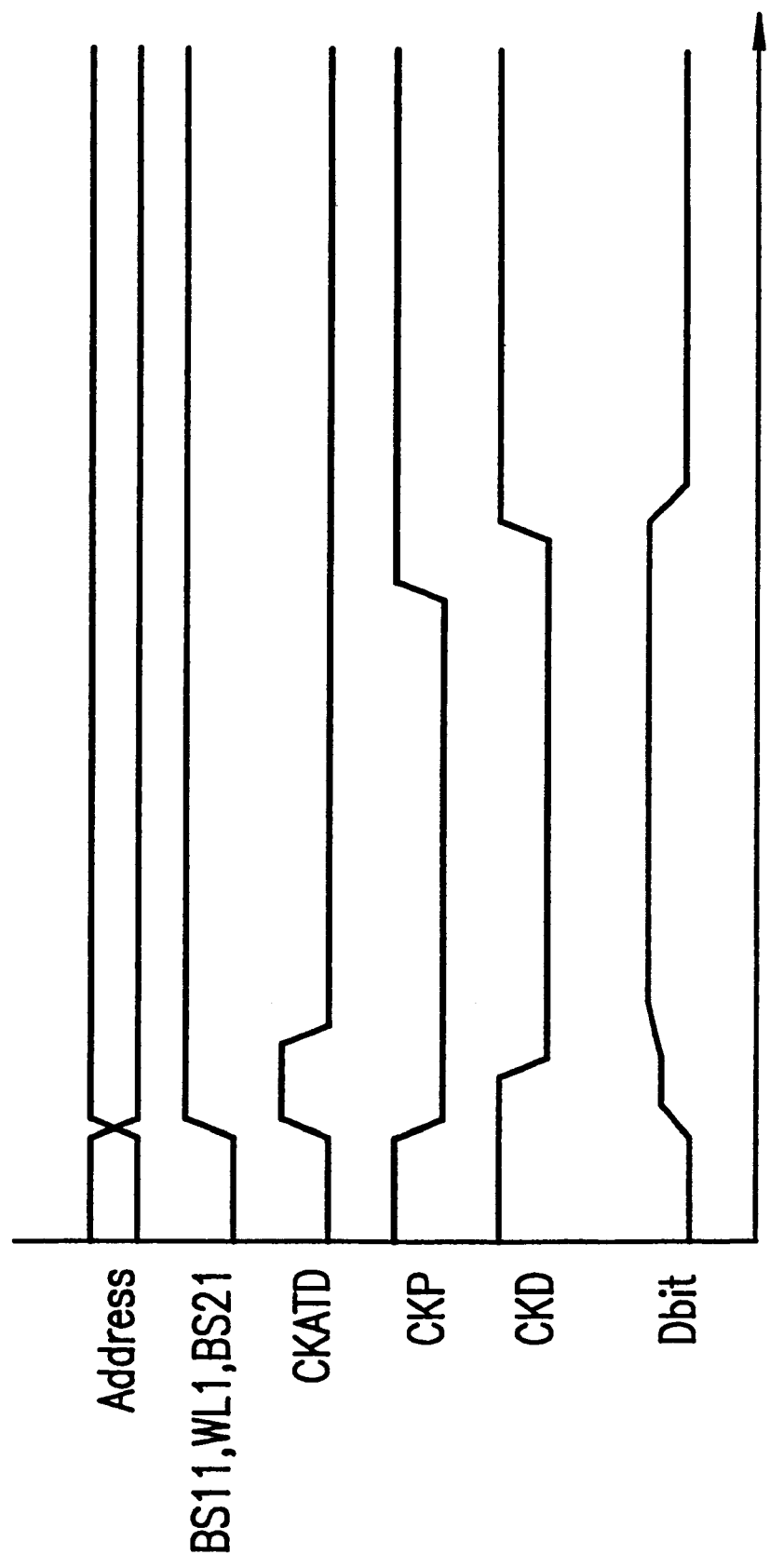
FIG. 4 is an operation timing chart for a semiconductor read only memory shown in FIG. 1 according to the embodiment of the present invention.
Figure 5:
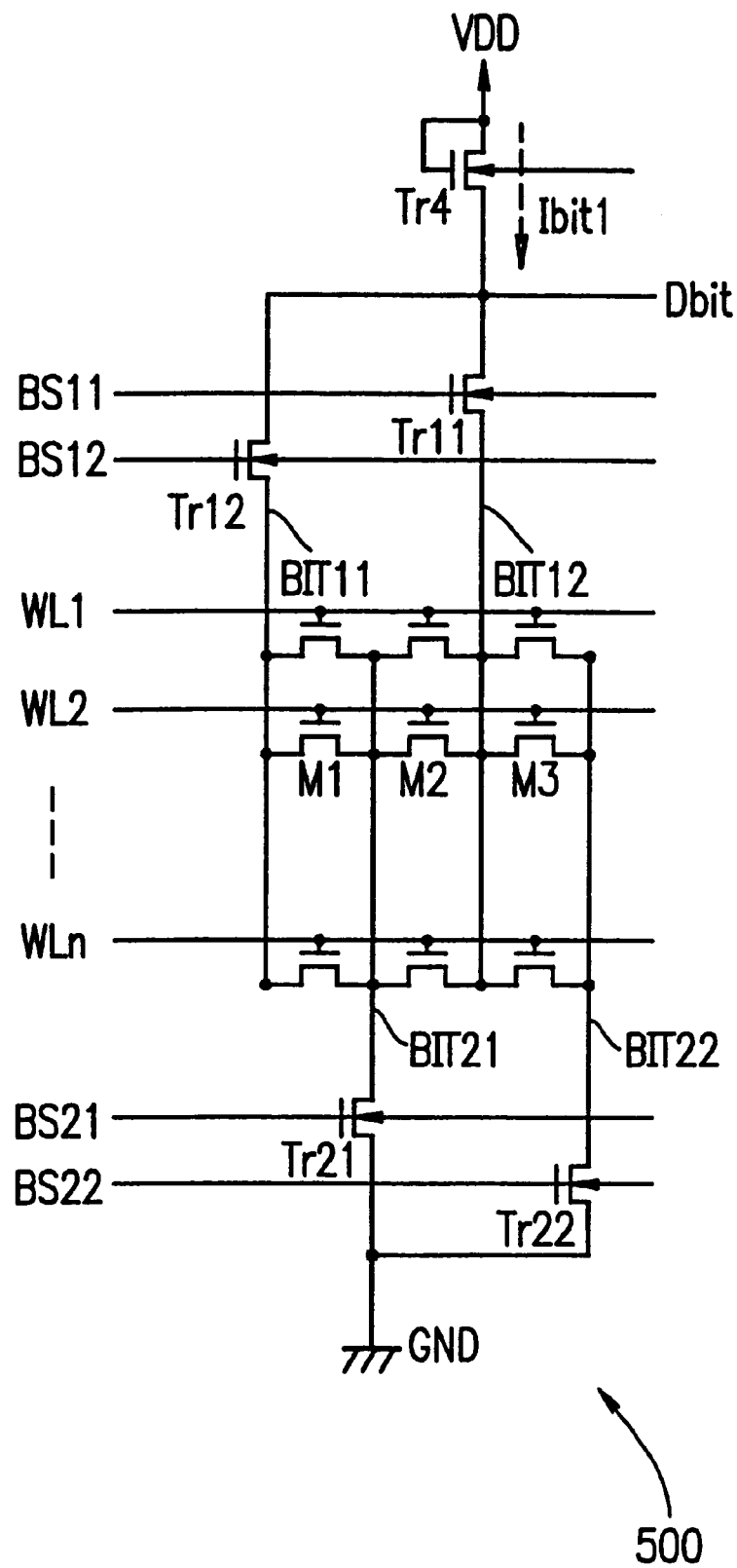
FIG. 5 shows a structure of a semiconductor read only memory according to the conventional art.
Figure 6:
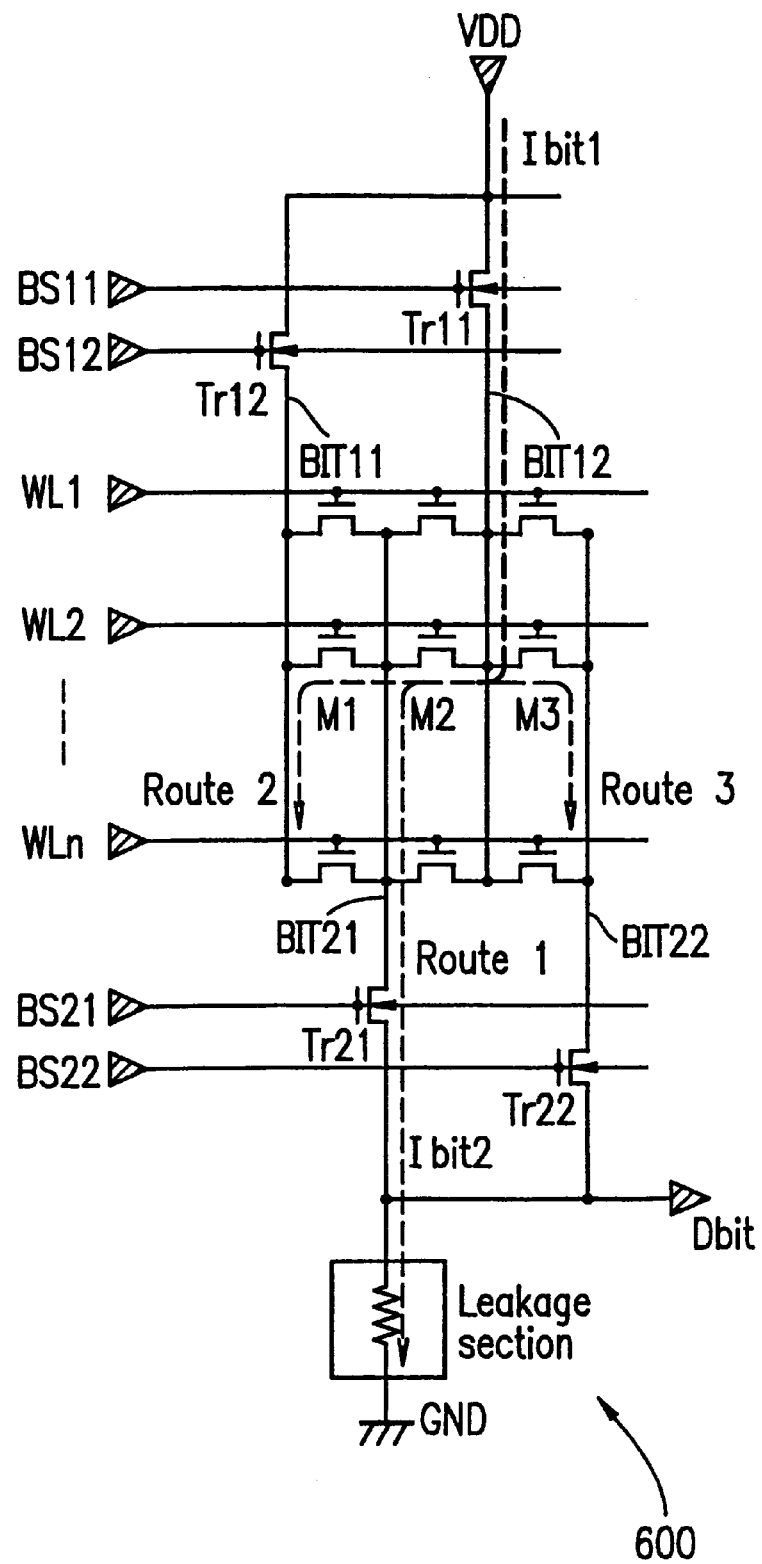
FIG. 6 shows a NOR type semiconductor storage device according to the conventional art.

FIG. 3 shows an address transition detector circuit (ATD circuit) 30 and a pulse generating circuit 40. Based on a transition of the address, the ATD circuit 30 and the pulse generating circuit 40 generate a signal CKP, as shown in FIG. 4. Specifically, the ATD circuit 30 receives an address signal and generates a signal CKATD (FIG. 4) based on the address signal. The pulse generating circuit 40 receives the signal CKATD and generates a signal CKP based on the signal CKATD.

Referring to FIG. 1 again, a source electrode of the read charging transistor Tr4 is connected to a power supply VDD. A gate electrode of the read charging transistor Tr4 receives the signal CKP.

Gate electrodes of the bit line selecting transistors Tr21 and Tr22 are connected to bit line selecting lines BS21 and BS22, respectively. Source electrodes of the bit line selecting transistors Tr21 and Tr22 are connected to a drain electrode of a discharging transistor Tr3 which is connected to a ground GND. A gate electrode of the discharging transistor Tr3 receives from a delay circuit 10 a charge control signal CKD, which is obtained by delaying the signal CKP as shown in FIG. 4. Preferably, the conductive type of the transistors Tr3 and Tr4 are different. Moreover, the transistors Tr3 and Tr4 may be MOS transistors.

Now, an operation for reading data stored in the memory cell transistor M2 of the semiconductor memory 100 is described.

Consider a case where data stored in the memory cell transistor M2 is "0". In order to read the data stored in the memory cell transistor M2, the decoder circuit 20 shown in FIG. 2 receives an address signal and generates a bit line selecting signal based on the address signal. In response to the bit line selecting signal, the bit line selecting lines BS11 and BS21 go high, thereby selecting the bit lines BIT12 and BIT21 connected to the memory cell transistor M2. On the other hand, the bit line selecting lines BS12 to BS1n and BS22 to BS2n, except the bit line selecting lines BS11 and BS21, are low.

Furthermore, the word line WL2 connected to the memory cell transistor M2 goes high in response to the signal from the decoder circuit 20 shown in FIG. 2. The word lines WL1 to WLn, except the word line WL2, remain low. Thus, the bit lines BIT12 and BIT21 are electrically connected to each other through the memory cell transistor M2.

As shown in FIG. 4, the signal CKP goes low in response to a change of the address, remains low during a predetermined period, and goes high after the end of the predetermined period. When the signal CKP goes low in response to a change of the address, the read charging transistor Tr4 is turned ON, while the bit line selecting lines BS11 and BS21 and the word line WL2 go high, as described above. As a result, a current is routed from the power supply VDD, through the bit line selecting transistor Tr11 and the memory cell transistor M2, to the bit line selecting transistor Tr21.

Furthermore, the charge control signal CKD to be received by the discharging transistor Tr3 is a signal obtained by delaying the signal CKP. Therefore, as shown in FIG. 4, when the signal CKP falls, the signal CKD is high. Accordingly, referring to FIG. 1, the discharging transistor Tr3 is ON, and a current is routed from the power supply VDD, through the bit line selecting transistor Tr11, the memory cell transistor M2, the bit line selecting transistor Tr21, and the discharging transistor Tr3, to the ground GND. The potential of the output signal line Dbit is the product of the current flowing along the above route and the resistance of the discharging transistor Tr3.

The fall of the signal CKP triggers the above-described operation, whereby a large noise is caused. However, the effects of the noise on the potential of the output signal line Dbit is small because the potential of the output signal line Dbit depends on a direct current. Then, the signal CKP is delayed by the delay circuit 10 shown in FIG. 1, so as to generate the charge control signal CKD. When the charge control signal CKD to be provided to the discharging transistor Tr3 goes low, the discharging transistor Tr3 is turned OFF. Thus, the potential of the output signal line Dbit is charged up to a value that is equal to a difference between a value of the power supply VDD and the threshold value of the bit line selecting transistor Tr11.

At this time, although the direct current route is not conducted to the ground GND, the potential of the output signal line Dbit is stable because the signals except the charge control signal CKD are stable and the possibility that a noise occurs is accordingly small.

By sensing a signal from the output signal line Dbit by a sense amplifier (not shown), data stored in the memory cell transistor M2 can be correctly read out. Furthermore, since the direct current flows through the output signal line Dbit only during the delay time provided by the delay circuit 10, the consumption current is significantly reduced.

FIG. 4 is a timing chart showing the potentials of the address signal, the bit line selecting lines BS11 and BS21, the word lines WL1, the signal CKP, the charge control signal CKD, and the output signal line Dbit. Specifically, FIG. 4 shows the transition of the potential of the output signal line Dbit of the semiconductor memory 100 based on the address signal indicating the memory cell transistor M2 storing data "0".

Next, an operation of the semiconductor memory 100 in the case where the data stored in the memory cell transistor M2 is "1".

In order to read the data stored in the memory cell transistor M2, the bit line selecting lines BS11 and BS21 go high, thereby selecting the bit lines BIT12 and BIT21 connected to the memory cell transistor M2.

The decoder circuit 20 shown in FIG. 2 receives an address signal and generates a bit line selecting signal based on the address signal. At this time, the bit line selecting lines BS12 to BS1n and BS22 to BS2n, except the bit line selecting lines BS11 and BS21, go low.

Furthermore, the word line WL2 connected to the memory cell transistor M2 goes high in response to the signal from the decoder circuit 20 shown in FIG. 2. The word lines WL1 to WLn, except the word line WL2, remain low.

In this case, since the data stored in the memory cell transistor M2 is "1", the bit lines BIT12 and BIT21 are not connected.

Although the signal CKP and the charge control signal CKD are generated in response to the change of the address, the bit lines BIT12 and BIT21 are not connected. Accordingly, a current route is not formed between the power supply VDD and the discharging transistor Tr3 and, therefore, the output signal line Dbit remains low. Thus, it is clearly appreciated that the potential of the output signal line Dbit is stabilized at a low level because the probability that a noise occurs is small even after the charge control signal CKD has gone low to turn the discharging transistor Tr3 OFF.

A semiconductor memory of the present invention includes a plurality of memory cell transistors arranged in a matrix. Drain regions of the plurality of memory cell transistors in each column are formed as parts of the first bit line, while source regions of the plurality of memory cell transistors in each column are formed as parts of the second bit line of the column. The first bit line can be charged by a charging section. Each of the plurality of memory cell transistors in the column is connected to a discharging section through the second bit line. At the time when the charging for the first bit line is started by the charging section, the discharging section is electrically connected to the second bit line. The connection of the discharging section to the second bit line is disconnected after a predetermined period has passed since the start of charging.

According to the semiconductor memory of the present invention, data stored in memory cell transistors can be read correctly, while the power consumption during the reading operation can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory, comprising:
   a plurality of memory cell transistors;
   a plurality of first bit lines;
   a plurality of second bit lines;
   a first transistor provided between a charging section for charging at least one of the plurality of first bit lines and the plurality of memory cell transistors; and
   a second transistor provided between a discharging section for discharging at least one of the plurality of second bit lines and the plurality of memory cell transistors, wherein
   one of a source region and a drain region of each of the plurality of memory cell transistors is formed as a part of one of the plurality of first bit lines, and the other of a source region and a drain region is formed as a part of one of the plurality of second bit lines;
   an ON/OFF state of the first transistor is controlled based on a first signal;
   an ON/OFF state of the second transistor is controlled based on a second signal; and
   the second signal is provided to the second transistor at a time which is delayed for a predetermined period from a time that the first signal is provided to the first transistor.

2. A semiconductor memory according to claim 1, wherein the second transistor is ON at a time when charging for at least one of the plurality of first bit lines is started by the charging section.

3. A semiconductor memory according to claim 2, wherein the second transistor is turned OFF at a time when a predetermined period has passed since the start of charging.

4. A semiconductor memory according to claim 1, further comprising a delay circuit for delaying the first signal so as to generate the second signal and providing the second signal to the second transistor.

5. A semiconductor memory according to claim 1, wherein a potential of at least one of the plurality of second bit lines is used as an output signal.

6. A semiconductor memory according to claim 1, wherein the conductive type of the first transistor is different from that of the second transistor.

7. A semiconductor memory according to claim 1, wherein the first and second transistors are MOS transistors.

* * * * *